United States Patent [19]
Raaijmakers et al.

[11] Patent Number: 6,113,698
[45] Date of Patent: Sep. 5, 2000

[54] DEGASSING METHOD AND APPARATUS

[75] Inventors: Ivo Raaijmakers, Phoenix, Ariz.; Dan Marohl, San Jose, Calif.

[73] Assignee: Applied Materials, Inc., Santa Clara, Calif.

[21] Appl. No.: 08/889,990

[22] Filed: Jul. 10, 1997

[51] Int. Cl.[7] .................................................. C23C 16/00
[52] U.S. Cl. ............................................................ 118/715
[58] Field of Search ................................. 118/724, 725, 118/715; 156/345; 438/706

[56] References Cited

U.S. PATENT DOCUMENTS

| | | |
|---|---|---|
| 4,816,638 | 3/1989 | Ukai et al. . |
| 4,854,263 | 8/1989 | Chang et al. . |
| 5,314,542 | 5/1994 | Saito et al. ............................ 118/725 |
| 5,374,594 | 12/1994 | van de Ven et al. . |
| 5,377,425 | 1/1995 | Kawakami et al. . |
| 5,478,429 | 12/1995 | Komino et al. ......................... 156/345 |
| 5,665,167 | 9/1997 | Deguchi et al. ........................ 118/728 |
| 5,673,750 | 10/1997 | Tsubone et al. ......................... 165/275 |

OTHER PUBLICATIONS

A. Fujie, "Study on Practical Service of Acoustic Levitation and Transportation System of Silicon Wafer," pp. 214–224.
M. Yagai et al., "Ultra Clean N2 Gas Environment Wafer Transport System—Large Size Wafer—," pp. 225–233.
D.R. Wright et al., "Low temperature etch chuck: Modeling and experimental results of heat transfer and wafer temperature," J. Vac. Sci. Technol. A. 10(4), Jul./Aug. 1992, pp. 1065–1070.

Primary Examiner—Richard Bueker
Assistant Examiner—Erin Fieler
Attorney, Agent, or Firm—Valerie G. Dugan

[57] ABSTRACT

An apparatus and method for clamping and heating a wafer without using moving parts and without exposing the wafer to external stress is provided. A high backside wafer pressure which provides efficient heat transfer from a heated substrate support to the wafer is offset by a high frontside wafer pressure higher than or lower than the backside wafer pressure. The high frontside pressure reduces wafer stress by providing a uniform frontside/backside pressure and presses the wafer against the heated substrate support. A continuous gas purge for providing a viscous flow across the wafer to carry away desorbed contaminants, and frontside heating elements for improving desorption are provided.

17 Claims, 6 Drawing Sheets

DEGASSING METHOD AND APPARATUS

CROSS REFERENCE TO RELATED APPLICATIONS

The present application is related to commonly owned application serial number U.S. Pat. application Ser. No. 08/891,048 filed Jul. 10, 1997, which is incorporated herein by reference.

FIELD

The present invention relates generally to the field of semiconductor device fabrication, and specifically to degassing semiconductor wafers.

BACKGROUND

Semiconductor substrates and the layers deposited thereon (collectively referred to herein as a "wafers") absorb water vapor and other gases and impurities (e.g., hydrocarbons) when exposed to the same (e.g., when a wafer is removed from a vacuum chamber). These gases and impurities degrade film properties and therefore must be desorbed and driven off the wafer (i.e., the wafer must be degassed) before further films are deposited thereon.

One conventional degas module uses infrared radiation to heat the wafer to a desired temperature. The infrared radiation originates from an array of lamps positioned above the wafer. The wafer's temperature is measured using infrared pyrometry, a measure of the infrared radiation emitted from the wafer and, if the emissivity of the wafer is known, a measure of the wafer's absolute temperature. A major disadvantage of heating a wafer by infrared radiation and measuring its temperature by infrared pyrometry is the substantial transparency of most common substrate materials (e.g., silicon) to infrared wavelength radiation at the temperature range of interest for degassing (150–500° C). Because most substrates are transparent to infrared wavelengths, the rate at which a wafer heats is dependent on the presence of other non-transparent (i.e., energy absorbing) layers, and device patterning placed on the wafer before it enters the degas chamber. Furthermore, any layers or device patterns which may be present from previous process steps affect the wafer's emmissivity making it difficult to obtain an accurate wafer temperature measurement by infrared pyrometry.

In order to achieve heating rates independent of wafer patterning some conventional degas methods employ a heated substrate support. However, due to surface roughness of both the wafer and the substrate support, small interstitial spaces may remain between the substrate support and the wafer which effectively decreases the contact area and heat transfer rate. Particularly in vacuum environments, this decreased contact area causes heat transferred to be dominated by radiation, which is slow at the temperatures of interest. These spaces interfere with and cause non-uniform heat transfer from the substrate support to the wafer. To promote more uniform heat transfer, a heat transfer gas such as argon, helium or nitrogen is often used to fill the interstitial spaces between the wafer and the substrate support. This gas has better heat transfer characteristics than the vacuum it replaces and therefore acts as a thermal medium for heat transfer from the substrate support to the wafer. The heat transfer coefficient of such a system is dependent on the spaces between the wafer and the substrate support and on the pressure, the atomic mass and the accommodation coefficient of the heat transfer medium. Small spaces and high pressures generate the best heat transfer.

In an effort to achieve smaller spaces, more efficient heating and more uniform wafer temperatures, conventional degassing apparatuses mechanically clamp the wafer to the substrate support using a clamp ring which contacts the outer edge of the wafer's frontside (i.e., a side that faces into the chamber). The clamp ring holds the wafer against the substrate support to maintain the necessary gas pressure between the substrate support and the wafer's backside (i.e., a side that faces the substrate support) a lower pressure is therefore maintained on the wafer's frontside. However, the opposing forces applied to the wafer by the clamp ring and by the backside gas pressure may cause the wafer to bow. A 10 Torr backside pressure causes an 8 inch wafer to bow about 1 mm at the wafer's center, and causes a 12 inch wafer to bow about 5 mm at the wafer's center. This bow increases the space between the substrate support and the wafer's backside, thereby decreasing the backside pressure and deteriorating heat transfer. Moreover, backside pressure can cause the stress in the substrate to exceed the substrate's yield strength and break the wafer.

In addition to the disadvantages described above, mechanical clamping of the wafer is undesirable because the clamp ring consumes otherwise patternable surface area and because the surface contact between the wafer and the clamp ring promotes particle generation particularly as the wafer heats and expands. Accordingly, a need exists for a degassing apparatus and method that heats wafers independent of individual wafer patterning, that reduces wafer bowing, that reduces particles generated by contact between moving parts, and that increases patternable surface area.

SUMMARY OF THE INVENTION

The present invention provides a degassing apparatus and method for effectively clamping and heating a wafer without using moving parts, and without exposing a wafer to external stress. In the present invention, very high backside wafer pressures are effectively offset by a high frontside wafer pressure, which may be higher than or lower, than the backside wafer pressure. The high backside pressure provides very efficient heat transfer from the heated substrate support to the wafer; the high frontside pressure offsets the backside pressure, reducing wafer stress and when the frontside pressure exceeds the backside pressure, pressing the wafer toward the heated substrate support.

Various features of the invention include configurations that generate a vacuum pressure differential between a wafer's frontside and a wafer's backside. Because vacuum levels and pressure levels are inversely related, for simplicity, consistent reference is made herein to pressure levels rather than vacuum levels. The invention also features a configuration that provides a continuous flow of dry gas across the wafer's surface. In such a configuration, during the degas process the dry gas is continuously flowed into the vacuum chamber via one or more gas inlets and continuously pumped out of the vacuum chamber via one or more gas outlets, creating a continuous gas purge. Thus, as the wafer heats desorbed contaminants are swiftly carried away in a viscous gas flow and do not reabsorb in chamber surfaces. Further features include heating elements (e.g., reflecting elements) within a manifold positioned opposite the substrate support to minimize the heat loss due to radiation. These features preferably heat the frontside of the wafer from a position within the vacuum chamber and preferably are positioned in close proximity with the wafer's frontside. With the use of such heating elements wafer heating and degassing continues to occur even as the chamber is being pumped out for wafer transfer.

In a first aspect a lower pressure (i.e., greater vacuum) is generated along a wafer's backside than the pressure generated along the wafer's frontside. This pressure differential (having greater frontside pressure) uniformly presses the wafer toward the substrate support, eliminating the need for a clamp ring and the particle generation associated therewith. The uniform pressure along the wafer's frontside and the uniform pressure along the wafer's backside promotes uniform heat transfer from the substrate support to the wafer while minimizing the wafer's exposure to external stress. A pressure differential and a continuous gas purge is achieved by coordinated operation of two gas inlets (a frontside gas inlet and a backside gas inlet) and two gas outlets (a frontside outlet and a backside outlet) each outlet having its own gas pump operatively coupled thereto.

Similarly in a second aspect of the invention a greater pressure is generated along a wafer's frontside than the pressure generated along the wafer's backside. In this aspect, both a pressure differential and a continuous gas purge are achieved by coordinating operation of a single gas inlet (a frontside gas inlet) and two gas outlets (a frontside gas outlet and a backside gas outlet). Both gas outlets are operatively coupled to a common pump. In this aspect of the invention the reduction of parts advantageously provides a smaller, less expensive apparatus.

In a third aspect of the invention a greater pressure is generated along a wafer's backside than the pressure generated along the wafer's frontside, causing the wafer to float above the substrate support. In this aspect a pressure differential and a continuous gas purge is achieved by coordinating the operation of a single gas inlet (a backside gas inlet) and a single gas outlet (a frontside gas outlet) coupled to a single pump. Because contact between the wafer and the substrate support is eliminated during wafer heating, this aspect of the invention substantially reduces particle generation. In this aspect, wafer flotation due to a somewhat higher backside pressure (as compared to the frontside pressure) can also be achieved with two gas inlets and separate pumps.

By reducing the number of particles (via elimination of the clamp ring), by reducing reabsorbed moisture (via a continuous gas purge) and by reducing wafer stress (via a uniform frontside/backside pressure differential) the present invention greatly improves the wafer degassing process. Accordingly with use of the present invention less contamination and stress induced failures occur, and product yields increase. Also, since heat-up rates and degassing rates are higher with the present invention than with conventional radiatively heated degassing systems, the throughput of the overall semiconductor fabrication system is increased. These and other objects, features and advantages of the present invention will become more fully apparent from the following detailed description of the preferred embodiments, the appended claims and the accompanying drawings.

DETAILED DESCRIPTION OF THE PREFERRED EMBODIMENTS

Figure 1A:
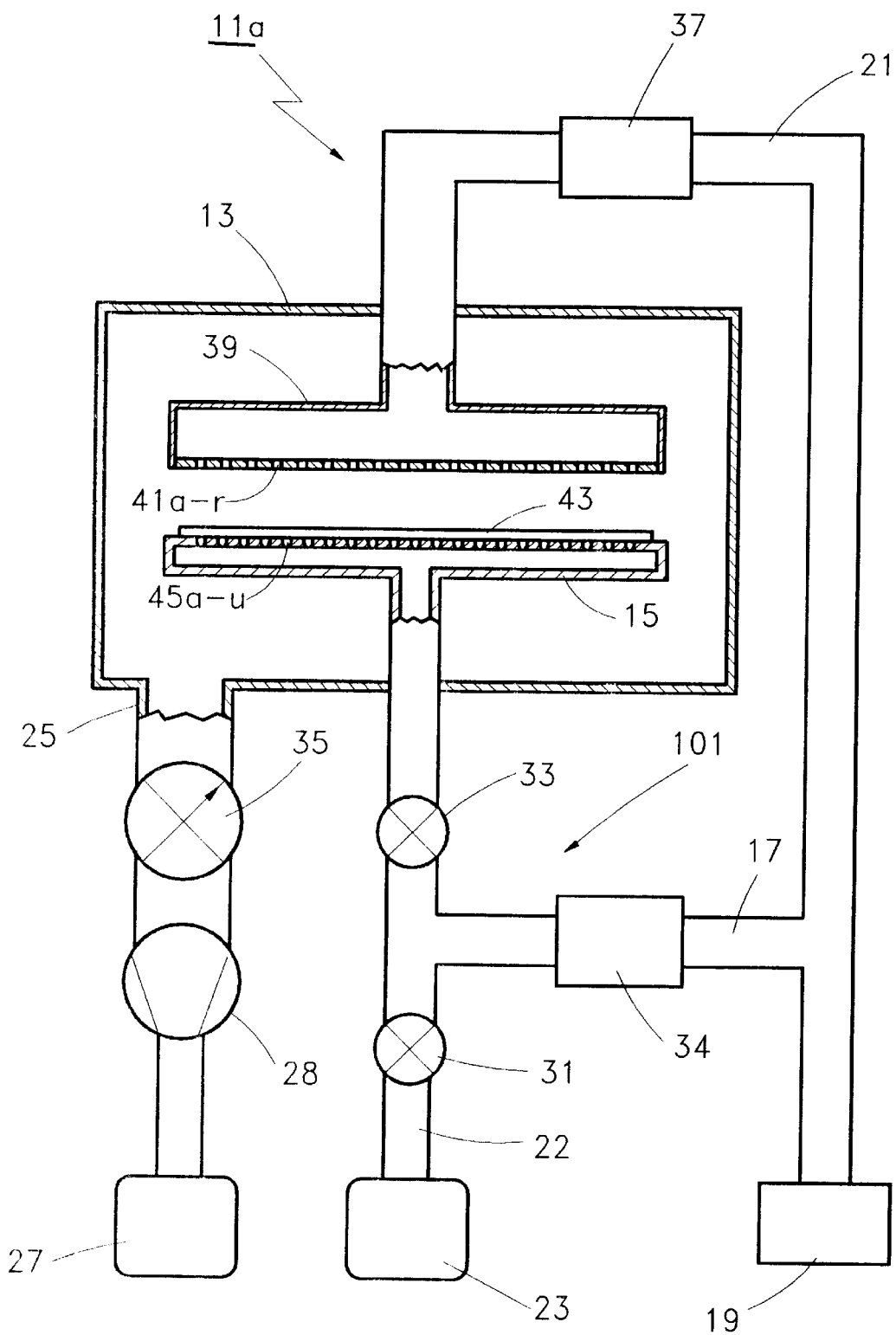
FIG. 1A is a side elevational view of a degassing apparatus made in accordance with a first aspect of the invention.

FIG. 1A is a side elevational view of a first degassing apparatus 11a made in accordance with a first aspect of the invention. In order to conveniently describe the inventive apparatus its components will be described with reference to the object to be degassed. However, it is understood that the object itself is not a part of the apparatus.

As shown in FIG. 1A the first degassing apparatus 11a comprises a vacuum chamber 13 containing a heated substrate support 15. A backside gas inlet 17 couples a dry gas source 19 (such as a nobel gas or nitrogen with preferably less than 10 parts per billion of general contaminants, such as water, hydrogen, hydrocarbons, etc.) in fluid communication with the vacuum chamber 13 through the heated substrate support 15 and along the backside of the wafer, and a frontside gas inlet 21 which is preferably coupled to the vacuum chamber 13 at a position opposite the substrate support 15) couples the dry gas source 19 in fluid communication with the vacuum chamber 13. (As used herein "coupled through the heated substrate support" means coupled so as to provide fluid communication with the backside of an object placed on the heated substrate support.) The gas emitted from the dry gas source 19 may be further "dried" via a getter or cold trap (not shown) within the frontside gas inlet 21 and/or the backside gas inlet 17. A backside gas outlet 22 couples the vacuum chamber 13 in fluid communication with a backside gas pump 23 through the heated substrate support 15. A frontside gas outlet 25, which is preferably coupled to the portion of the vacuum chamber 13 adjacent the heated substrate support 15 (e.g., the lower portion of the vacuum chamber 13), couples a frontside gas pump 27 in fluid communication with the vacuum chamber 13. Preferably in order to pump the vacuum chamber 13 to high vacuum levels (e.g., less than $1 \times 10^{-6}$ Torr.) a turbo molecular pump 28 is further coupled between the vacuum chamber 13 and the frontside gas pump 27.

As shown in FIG. 1A the backside gas outlet 22 and the backside gas inlet 17 may merge in which case a backside pump throttle valve 31 is coupled between the backside gas pump 23 and the intersection of the backside gas outlet 22 and the backside gas inlet 17 (in order to minimize the flow of gas from the backside gas inlet 17 to the backside gas outlet 22). The pressure within the backside gas inlet 17 and the backside gas outlet 22 (i.e. within the backside manifold) is further regulated by a pressure regulator 34 coupled between the dry gas source 19 and the backside pump throttle valve 31. A backside gas switch-off valve 33 is coupled between the backside pump throttle valve 31 and the vacuum chamber 13 to control the flow of gas to and from the vacuum chamber 13, via the dry gas source 19 and the pressure regulator 34, respectively. The gas flow to the frontside gas pump 27 is controlled by a frontside pump throttle valve 35, and the gas flow to the vacuum chamber 13 through the frontside gas inlet 21 is adjusted via a mass flow controller 37 coupled to the frontside gas inlet 21.

Figure 1B:
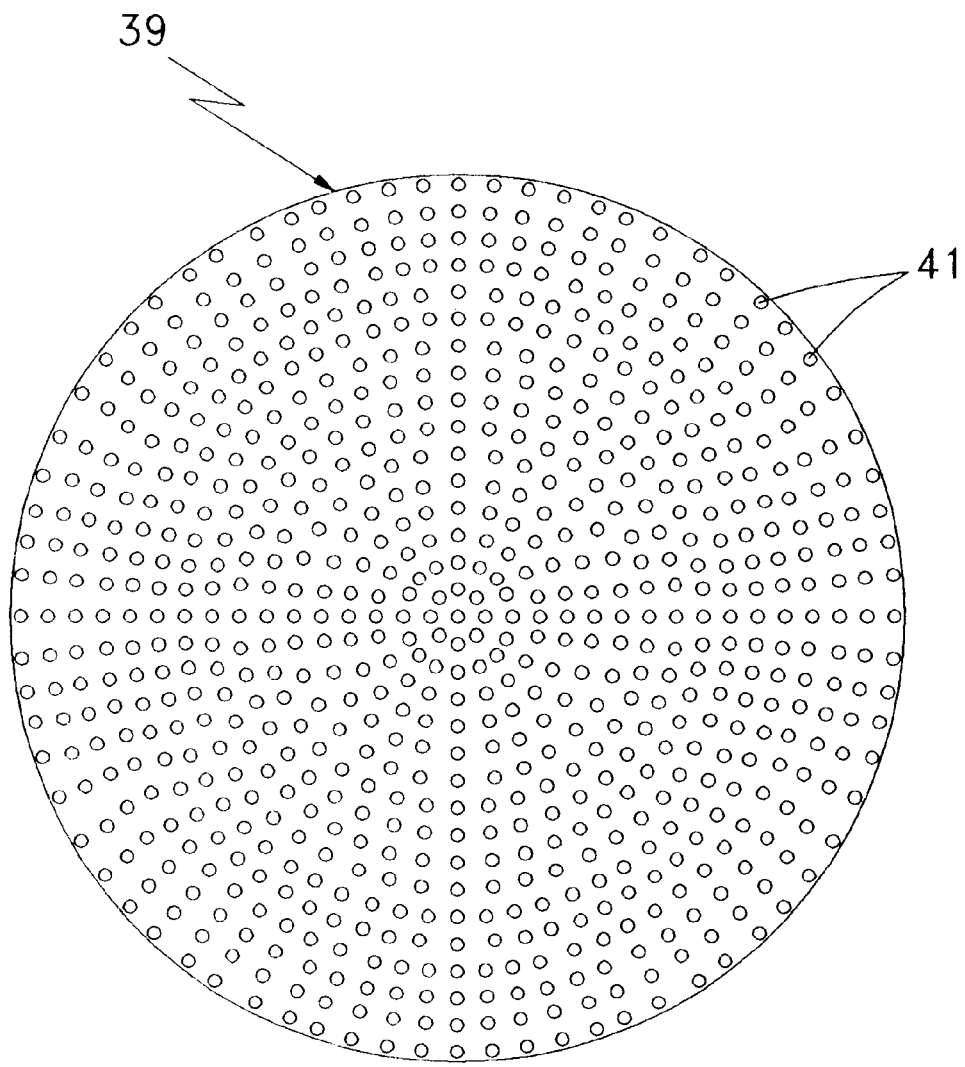
FIG. 1B is a bottom plan view of a manifold of the degassing apparatus.

In a preferred embodiment the frontside gas inlet 21 comprises a manifold 39, the footprint of which preferably approximately corresponds to the footprint of the heated substrate support 15 or to the footprint of a wafer placed on the heated substrate support 15. The manifold 39 comprises a plurality of openings 41*a–r* which diffuse gas emitted from the frontside gas inlet 21 into the vacuum chamber 13, causing a substantially uniform flow of dry gas over the wafer surface. The design of the manifold 39 (e.g., the specific number of openings 41*a–r*) depends primarily on the flow rate and type of the frontside gas, on the chamber pressure and on the spacing between the manifold 39 and the heated substrate support 15. Preferably the spacing between the openings 41 is comparable to, or smaller than, the distance between the substrate support 15 and the manifold 39. Presently between 50 and 5,000 openings are preferred. The general placement of the plurality of openings 41*a–r* can be seen with reference to FIG. 1B which shows a bottom plan view of the manifold 39. The design of such a manifold is well known to those of ordinary skill in the art of CVD reactor design. U.S. Pat. No. 4,854,263 entitled "Inlet Manifold and Method for Increasing Gas Dissociation and for PECVD of Dielectric Films" is incorporated herein for it teaching of a specific inlet manifold. The manifold 39 is positioned in sufficiently close proximity to the heated substrate support 15 such that a desired amount of the frontside gas flux emitted therefrom will contact and flow parallel to the frontside of the wafer 43 (e.g., an amount sufficient to carry away contaminants as they are desorbed from the wafer 43). A spacing between the manifold 39 and the heated substrate support 15 between 3 mm and 25 mm is presently preferred.

Figure 1C:
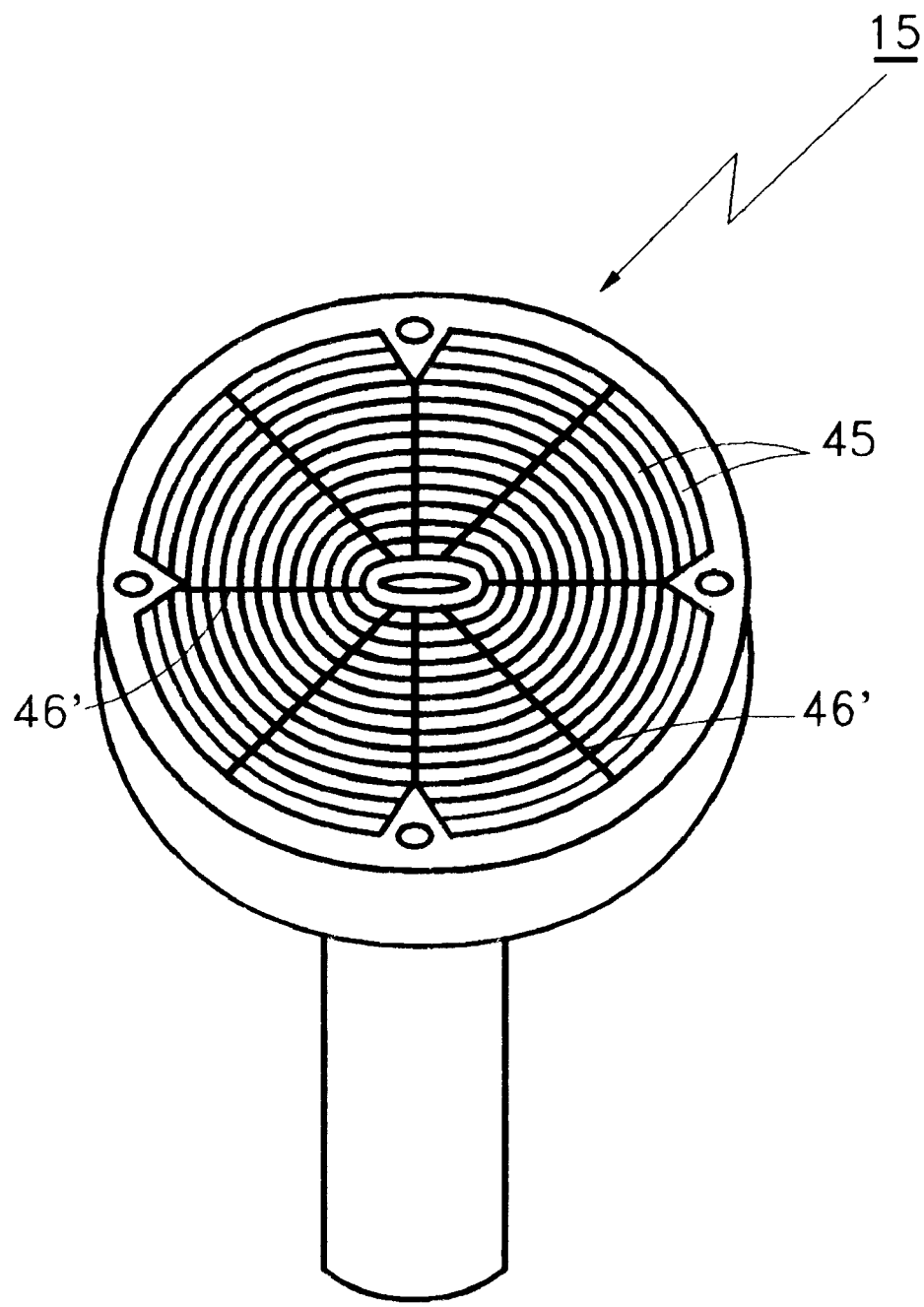
FIG. 1C is a top isometric view of a heated substrate support of the degassing apparatus.

The backside gas inlet 17 is coupled to the vacuum chamber 13 via the heated substrate support 15, which preferably has a plurality of grooved openings 45*a–u* similar to the plurality of openings 41*a–r* of the manifold 39. Thus, a dry gas may pass from the backside gas inlet 17 to the wafer's 43 backside via the plurality of grooved openings 45*a–u*. These grooved openings 45*a–u* diffuse the dry gas emitted to the wafer's 43 backside promoting uniform pressure and uniform heat transfer across the wafer's 43 backside. Furthermore, grooving the openings 45 increases the surface area of the wafer 43 directly exposed to the dry gas. The placement of the plurality of grooved openings 45*a–u* can be seen with reference to FIG. 1C which shows a top isometric view of an exemplary heated substrate support 15. As shown in FIG. 1C the plurality of grooved openings 45 preferably comprise a number of concentric rings which are divided along a number of evenly spaced radial lines 46. The number of grooved openings 45 may vary depending on the frontside and backside wafer pressures, the flow rate of the backside gas, the location of the heater, and the like.

In operation a wafer 43 is placed on the heated substrate support 15 with the backside of the wafer 43 facing the heated substrate support 15. The heat to the heated substrate support 15 is turned on and a frontside gas flux is flowed into the vacuum chamber 13 via the manifold 39. In addition to, or as an alternative to heating the substrate support 15, heat may also be provided via heated liquid flowed through sealed channels in the manifold 39, via heating elements within the manifold 39, or via infrared lamps directed toward the heated substrate support 15. Reflective metal heating elements within the manifold 39 (similar to the reflectors described in previously incorporated U.S. patent application Ser. No. 08/891,048, filed Jul. 10, 1997) also may be employed to reflect heat radiating from the wafer 43 back to the wafer 43 to further enhance wafer heat-up rate and wafer temperature uniformity. The mass flow controller 37 controls the flow rate of the frontside gas flux. The flow rate of the frontside gas flux is chosen so that a desired amount of gas flux contacts the wafer's 43 frontside before being pumped out of the vacuum chamber 13. Typically the mass flow controller 37 is set so the frontside gas flow rate is in the range of 1–25 standard liters per minute (s.l.m.) and preferably is about 5 s.l.m. The frontside pump throttle valve 35 is set so that the pressure along the wafer's 43 frontside is in the range of 10–100 Torr, preferably 50 Torr. The setting of the frontside pump throttle valve 35 depends on the setting of the mass flow controller 37 (e.g., a higher frontside gas flow rate requires less throttling in order to maintain the desired frontside pressure).

When the pressure along the wafer's frontside exceeds 10 Torr (sufficiently pressing the wafer 43 against the heated substrate support 15) the backside gas switch-off valve 33 is opened emitting a backside gas flux from the dry gas source 19 to the wafer's 43 backside via the backside gas inlet 17 and the grooved openings 45*a–u* in the heated substrate support 15. The backside gas pump 23, the frontside gas pump 27, the mass flow controller 37 and the pressure regulator 34 are turned on and adjusted such that the pressure along the wafer's 43 backside is less than that along the wafer's 43 frontside. The backside gas may be alternately flowed to and pumped from the wafer's backside by proper sequential operation of backside pump throttle valve 31 and the pressure regulator 34. This alternative pumping and flowing of gas may occur one or more times for each wafer being degassed. When repeated many times the alternative pumping and flowing simulates a continuous backside purge.

Preferably the pressure differential between the pressure along the wafer's 43 frontside and the pressure along the wafer's 43 backside is in the range of 1–10 Torr. For example, when the pressure along the frontside of the wafer 43 is set between 46 and 55 Torr, the pressure regulator 34 is preferably set to provide a pressure of 45 Torr along the wafer's backside, providing a 1–10 Torr pressure differential and pushing the wafer toward the substrate support 15. A frontside pressure of 50 Torr with a frontside/backside pressure differential of 5 Torr is preferred. The pressure differential causes the wafer 43 to be firmly pressed against the heated substrate support 15.

Thus, while the backside wafer pressure can be very high, it is effectively offset by the frontside wafer pressure. The high backside wafer pressure provides very efficient heat transfer from the heated substrate support 15 to the wafer 43; the higher frontside wafer pressure (higher than the backside wafer pressure) offsets the backside wafer pressure, reducing wafer stress and pressing the wafer 43 onto the heated substrate support 15. Moisture is desorbed from the wafer 43 as it heats and the gas flow along the wafer's 43 frontside and backside effectively carries away the moisture desorbed by the wafer 43.

After adequate degassing of the wafer 43, the backside gas flux is shut off by setting the pressure regulator 34 to zero. Shortly thereafter, the frontside gas flux is shut off by the mass flow controller 37. The backside gas pump 23 continues to pump until the backside pressure is less than about 0.1 Torr. The frontside gas pump 27 continues to pump gas from the backside and frontside of the wafer 43, respectively, until the frontside and backside of the wafer 43 are each at a pressure of less than $10^{-6}$ Torr. The degassed wafer 43 is then transferred to a process chamber (not shown) for further processing.

Figure 2:
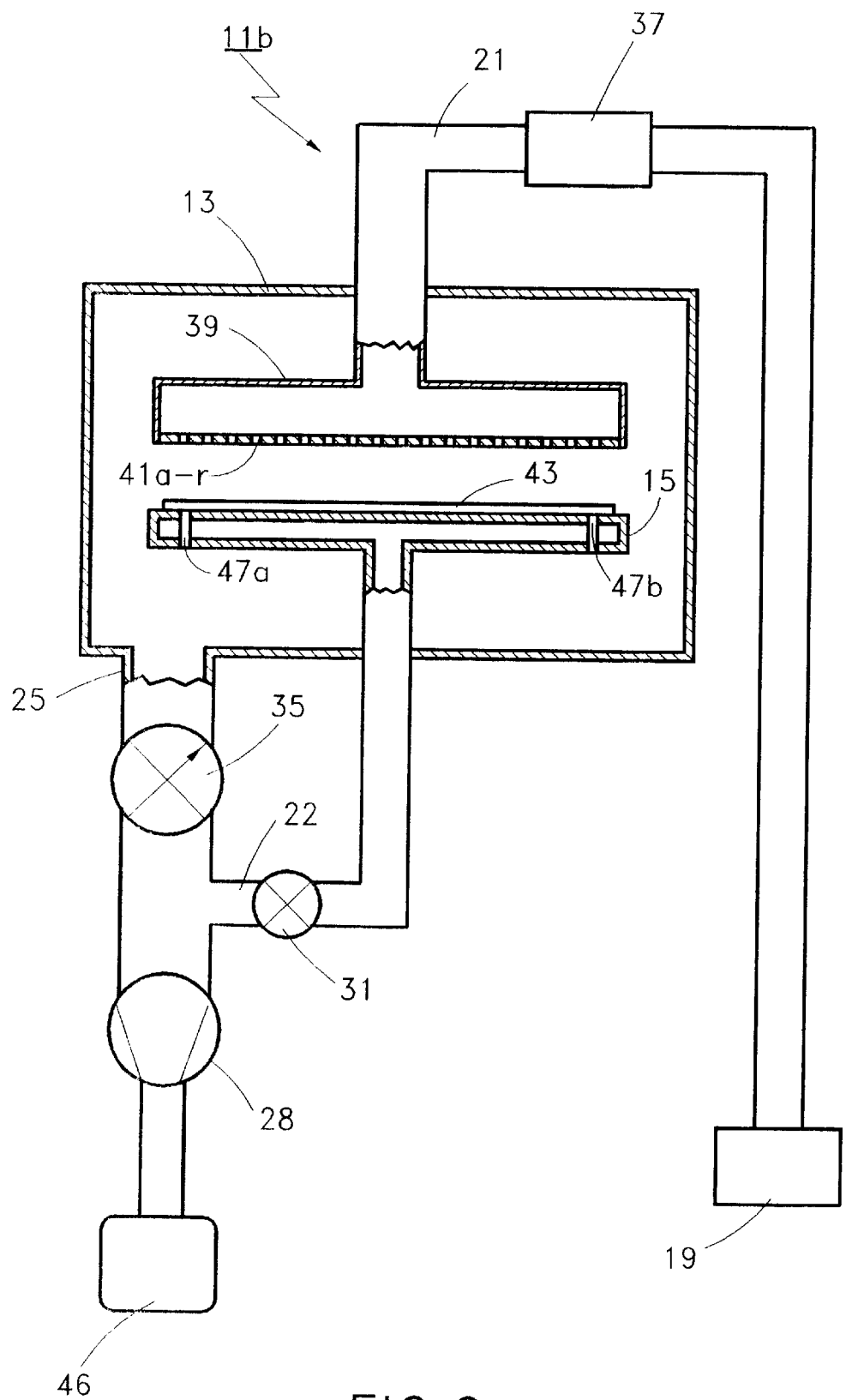
FIG. 2 is a side elevational view of the degassing apparatus made in accordance with a second aspect of the invention.

FIG. 2 is a side elevational view of a second degassing apparatus 11*b* made in accordance with a second aspect of the invention. The second degassing apparatus 11b comprises the vacuum chamber 13 having the heated substrate support 15 therein, as in the first degassing apparatus 11a. The frontside gas inlet 21 has the manifold 39 having the plurality of openings 41a–r for diffusing the dry gas emitted therefrom. The backside gas outlet 22 is coupled in fluid communication with the vacuum chamber 13 through the heated substrate support 15, and the frontside gas outlet 25 is also coupled in fluid communication with the vacuum chamber 13. The backside pump throttle valve 31 and the frontside pump throttle valve 35 control the gas flow rate through the backside gas outlet 22 and the frontside gas outlet 25, respectively. A single frontside/backside pump 46 operatively couples both the backside gas outlet 22 and the frontside gas outlet 25. Additionally one or more passageways 47a–b are provided in the heated substrate support 15 to allow the frontside gas flux to reach the grooves between the heated substrate support 15 and the wafer's 43 backside. The backside gas outlet 22 and the frontside gas outlet 25 are preferably coupled to the frontside/backside gas pump 46 via the turbo molecular pump 28.

In this aspect of the invention no backside gas is employed, rather a single frontside gas inlet 21 supplies dry gas for degassing both the wafer's 43 frontside and backside. The backside gas outlet 22 is maintained at a lower pressure than the vacuum chamber 13, thus pulling gas through the passageways 47a–b along the wafer's 43 backside and out the backside gas outlet 22. The frontside gas inlet 21 supplies a frontside gas flux to the wafer's 43 frontside via the manifold 39. A portion of the frontside gas flows across the wafer's 43 frontside to degas the frontside of the wafer 43 and a portion of the frontside gas flows through the passageways 47a–b to degas the backside of the wafer 43. The frontside/backside gas pump 46 pumps gas from both the wafer's 43 front and backsides via the frontside gas outlet 25 and the backside gas outlet 22, respectively, thereby effectively degassing both the wafer's frontside and backside with a single gas inlet and a single gas pump. The frontside pump throttle valve 35 and the backside pump throttle valve 31 are set to maintain a greater pressure along the wafer's 43 frontside than that along the wafer's 43 backside, (i.e., gas is pumped through the backside gas outlet 22 at a higher rate than the rate at which gas is pumped through the frontside gas outlet 25) and/or the number and size of the passageways 47a–b restrict the flow of the frontside gas flux to the backside of the wafer 43, as described below. In some cases the backside pump throttle valve 31 may be omitted depending on the flow design of the heated substrate support 15 and the chamber pressure.

In operation the wafer 43 is placed on the heated substrate support 15 and a frontside gas flux is emitted from the dry gas source 19 to the vacuum chamber 13 via the frontside gas inlet 21 and the pumping action of the frontside/backside gas pump 46. The gas flow through the frontside gas inlet 21 causes the pressure along the wafer's 43 frontside to be greater than the pressure along the wafer's 43 backside. The wafer 43 is pressed against the heated substrate support 15 and heat transfer from the heated substrate support 15 to the wafer 43 is improved. The frontside pump throttle valve 35 and the backside pump throttle valve 31 are set so that the frontside/backside gas pressure difference and the respective pressure levels are as desired. For example, pump 46 may pump gas out of the backside gas outlet 22 at a faster rate than it pumps gas out of the frontside gas outlet 25 (i.e., the frontside pump throttle valve 35 and backside pump throttle valve 31 may be set so that the wafer's backside is pumped at a higher rate than that at which the wafer's frontside is pumped). The frontside/backside gas pump 46 is then turned on creating a pressure differential with greater pressure (lower vacuum) along the wafer's 43 frontside. Preferably the passageways 47a–b also help maintain a greater frontside pressure by restricting the flow of the frontside gas to the wafer's 43 backside. Thus, while the frontside/backside gas pump 46 operates, the wafer 43 continues to be pressed against the heated substrate support 15. As in the first degassing apparatus 11a, the manifold 39 is positioned in sufficiently close proximity to the heated substrate support 15 such that at least a portion of the frontside gas flux emitted from the manifold 39 will contact the frontside of the wafer 43 before being pumped out of the vacuum chamber 13.

The higher pump rate and the resultant lower pressure (greater vacuum) along the wafer's 43 backside causes at least a portion of the frontside gas flux to flow from the relatively higher pressure frontside through the passageways 47a–b to the lower pressure interstitial spaces between the heated substrate support 15 and the wafer's 43 backside. The passageways 47a–b restrict the flow of gas such that only a portion of the frontside gas passes through the passageways 47a–b to the wafer's 43 backside. The relative settings of the frontside pump throttle valve 35 and the backside pump throttle valve 31 cause a lower pressure to be maintained along the wafer's 43 backside than the pressure along the wafer's 43 frontside, and the wafer 43 is pressed against the heated substrate support 15.

The frontside gas flow and the frontside/backside pumping occur simultaneously creating a continuous gas purge. As the wafer 43 presses against the heated substrate support 15, the wafer 43 heats and moisture and gases are desorbed therefrom and carried away by the frontside gas flux that passes along the front and/or backside of the wafer 43 and out the frontside gas outlet 25 or the backside gas outlet 22, respectively. Thus, in this configuration, both the frontside and the backside of the wafer 43 are degassed. After adequate degassing, the frontside gas flux is shut off and the frontside pump throttle valve 35 and the backside pump throttle valve 31 are fully opened while the frontside/backside gas pump 46 continues to pump gas from the vacuum chamber 13. After the frontside and backside wafer pressures each reach a pressure of $10^{-6}$ Torr or less, the frontside/backside gas pump 46 is shut off and the wafer 43 is transferred for further processing.

Figure 3:
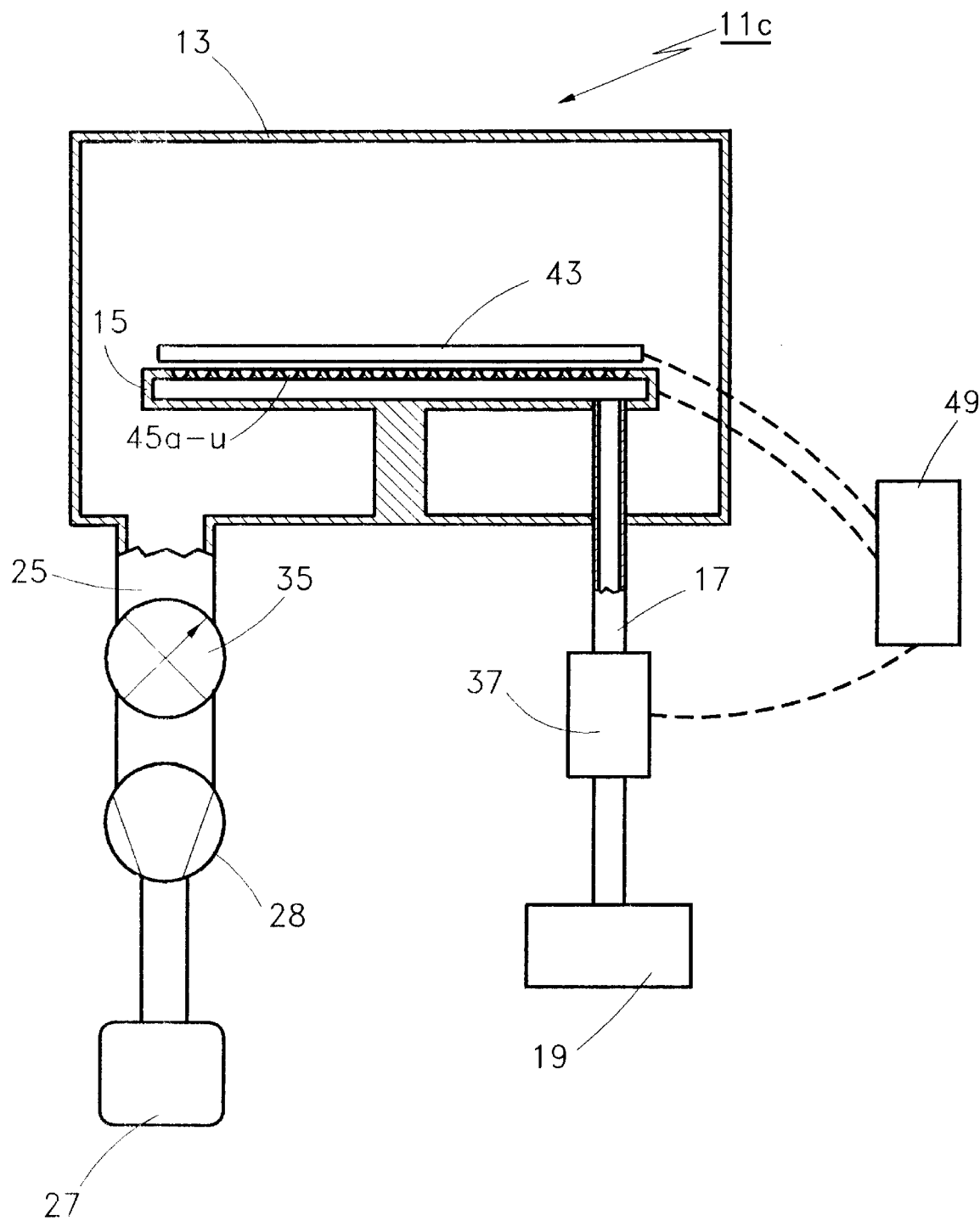
FIG. 3 is a side elevational view of the degassing apparatus made in accordance with a third aspect of the invention.

FIG. 3 is a side elevational view of a third degassing apparatus 11c made in accordance with a third aspect of the invention. As in the first degassing apparatus 11a and the second degassing apparatus 11b, the third degassing apparatus 11c comprises the vacuum chamber 13, the heated substrate support 15 and a system for maintaining a pressure difference between the frontside and the backside of the object to be degassed (e.g., the wafer 43). The third aspect of the invention employs a higher pressure along the backside of the wafer 43 than the pressure along the frontside of the wafer 43, causing the wafer 43 to float above the heated substrate support 15. Such wafer floatation reduces the particle generation that can occur when the substrate support and the wafer heat and expand at different rates.

In the configuration shown in FIG. 3 the backside gas inlet 17 couples the dry gas source 19 to the vacuum chamber 13 through the heated substrate support 15 and the plurality of grooved openings 45a–u which diffuse the backside gas flux. Grooved openings 45a–u are configured to direct the backside gas flux toward the center of the wafer 43 in order to achieve more stabilized floatation and to prevent the wafer 43 from moving out of position. Additionally, a containment ring or pins (not shown) may be used to maintain the wafer in position above the heated substrate support 15. The mass flow controller 37 controls the flow rate of the backside gas flux. A frontside gas pump 27, and preferably a turbo molecular pump 28 are coupled in fluid communication with the vacuum chamber 13 via the frontside gas outlet 25, and an optional measurement and feedback device 49 is operatively coupled to the heated substrate support 15, to the wafer 43 and to the mass flow controller 37. The measurement and feedback device 49 measures the distance between the heated substrate support 15 and the wafer 43 and transmits a signal to the mass flow controller 37 so that the mass flow controller 37 may adjust the gas flow rate or gas flow distribution to achieve a desired distance between the heated substrate support 15 and the wafer 43. The measurement and feedback device 49 may be any of number of conventional devices (e.g., a capacitance measurement device mounted within the vacuum chamber 13 on the substrate support 15, or an optical device mounted outside the vacuum chamber 13 and operatively coupled to the heated substrate support 15 via a quartz window in the vacuum chamber 13).

In operation, a wafer 43 is placed on the heated substrate support 15 and a dry gas flux is emitted from the backside gas inlet 17. The mass flow controller 37 and the frontside gas pump 27 are set so as to maintain a small excess of static and/or Bernoulli pressure along the wafer's 43 backside. The pressure differential required to float an object above the heated substrate support 15 varies depending on the size of the object to be floated. For instance, an average pressure differential of about 0.13 Torr is required to float a 12 inch wafer of 0.75 mm thickness. A worker of ordinary skill in the art will be readily able to determine the pressure differential required to float a given object. Once the mass flow controller 37 and the frontside gas pump 27 are appropriately adjusted, the frontside gas pump 27 and the measurement and feedback device 49 are turned on, and the mass flow controller 37 adjusts the gas flux to maintain the desired distance between the heated substrate support 15 and the wafer 43. The gas flux from the backside gas inlet 17 flows along the wafer's 43 backside as it enters the vacuum chamber 13, causing the wafer 43 to float above the heated substrate support 15. A portion of the gas flux flows from the backside of the wafer 43 to the frontside of the wafer 43. The gas flux, a heat transfer medium, transfers heat from the heated substrate support 15 to the wafer 43, causing the wafer 43 to heat to the desired temperature. As the wafer heats, moisture and other gases, impurities and contaminants are desorbed from both the frontside and the backside of the wafer 43 and carried away by the backside gas flux. The frontside gas pump 27 continuously pumps the gas flux and desorbed gases from the vacuum chamber 13. In this manner moisture and gas are carried out of the vacuum chamber 13 and do not reabsorb on the wafer 43, the vacuum chamber 13 or other components of the third degassing apparatus 11c. Additionally a frontside gas inlet as shown in FIGS. 1 and 2 may be employed to more effectively degas the wafer's frontside. After the wafer 43 is adequately degassed the dry gas source 19 is gradually turned off and the frontside gas pump 27 pumps the vacuum chamber 13 to a desired vacuum level. Thereafter the degassed wafer 43 is removed from the vacuum chamber 13 for further processing. It is understood that other floatation techniques (e.g., ultrasonic floatation) may be similarly employed to float the wafer 43, and the wafer 43 may be floated with the patterned side facing either the substrate support or facing into the chamber.

Figure 4:
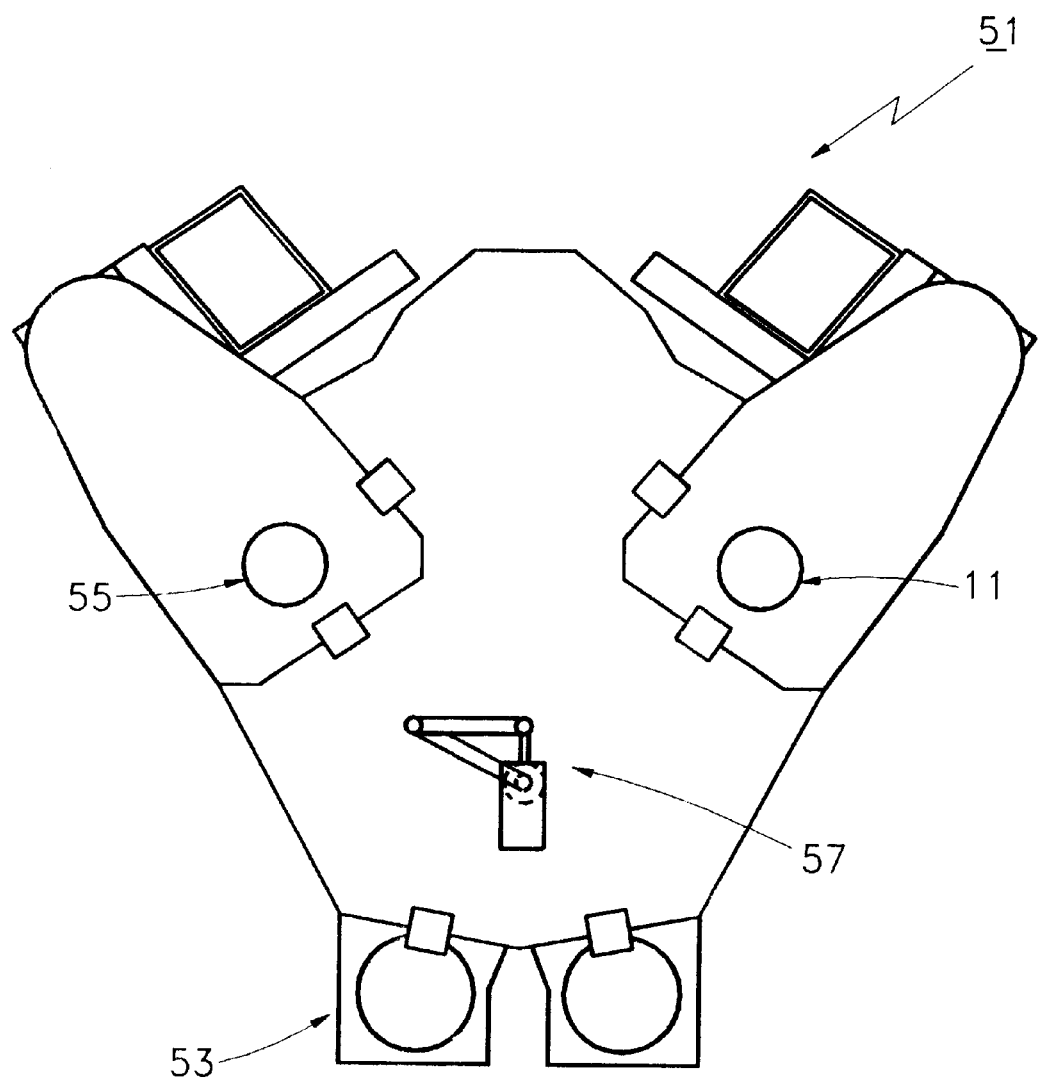
FIG. 4 is a top plan view of a fabrication tool that employs the inventive degassing apparatus of FIGS. 1, 2 or 3.

FIG. 4 is a top plan view of a fabrication system 51 that employs the inventive degassing apparatus of FIGS. 1, 2, or 3, generally represented by the numeral 11. The fabrication system 51 comprises at least a first load lock 53, at least one process chamber 55, at least one wafer handler 57 and the inventive degassing apparatus 11 configured in accordance with the first, second, or third aspect of the invention.

In operation a wafer carrier containing at least one wafer is loaded into the first load lock 53, and the first load lock 53 is pumped to the desired vacuum level. The wafer handler 57 extracts a first wafer and transports it to the inventive degassing apparatus 11. A sealable port such as a slit valve (not shown) on the vacuum chamber 13 opens allowing the wafer handler 57 to reach into the vacuum chamber 13 and deposit the first wafer on the heated substrate support 15. The wafer handler 57 retracts and the slit valve closes. The wafer is then degassed in accordance with the first, second, or third aspects of the invention. After degassing within the inventive degassing apparatus 11 is completed and the vacuum chamber 13 is evacuated as previously described, the slit valve opens and the wafer handler 57 extracts the first wafer and carries it to the process chamber 55 for further processing. The process chamber 55 preferably performs chemical or physical vapor deposition or etching, as these processes will be more successful on a thoroughly degassed wafer. After the first wafer is processed within the process chamber 55 it is returned to the first load lock 53. The sequence repeats until each wafer within the wafer carrier has been processed and returned to the first load lock 53.

The foregoing description discloses only the preferred embodiments of the invention, modifications of the above disclosed apparatus and method which fall within the scope of the invention will be readily apparent to those of ordinary skill in the art. For instance, although the components of the inventive degassing apparatus and the configuration described herein are presently preferred, numerous other configurations and varied components that fall within the scope of the claimed invention will be readily apparent to those of ordinary skill in the art. For instance, physical or chemical stimulation (e.g., radiation sources within the manifold and/or reactive gases such as $O_3$ or CO within the frontside or backside gas flux) may be used to further enhance wafer degassing. The various throttle valves, pressure regulators and mass flow controllers can be manually adjusted but are preferably computer controlled. The type of pumping apparatus disclosed herein are merely preferred; mechanical pumps, molecular pumps, drag pumps, pump stacks or any combination thereof may be similarly employed. The inventive degassing apparatus is not limited to processes which mount the object to be degassed on the lower portion of the chamber; the invention applies equally to top or side wall wafer mounting. Appropriate alteration of the process so as to prevent the wafer from falling from the heated substrate support 15 will be readily apparent to those of ordinary skill in the art. Further, numerous objects other than wafers (for example liquid crystal display panels and glass plates) may benefit from the inventive process.

Accordingly, while the present invention has been disclosed in connection with the preferred embodiments thereof, it should be understood that other embodiments may fall within the spirit and scope of the invention, as defined by the following claims.

What is claimed is:

1. A degassing apparatus comprising:

a vacuum chamber;

a heated substrate support within said vacuum chamber for supporting an object to be degassed, the object comprising a frontside and a backside wherein the backside faces said heated substrate support;

a frontside gas inlet coupled in fluid communication with said vacuum chamber, for supplying a gas flux at a first rate to the frontside of the object; and a pump coupled in fluid communication with the vacuum chamber for pumping the gas flux at a second rate from the backside of the object, and for pumping the gas flux at a third rate from the frontside of the object, said heated substrate support comprising at least one passageway for allowing the gas flux to pass from the frontside to the backside of the object, wherein the first rate, the second rate, the third rate and the at least one passageway are for generating a greater pressure on the frontside of the object than the pressure on the backside of the object.

2. The apparatus of claim 1 wherein the heated substrate support comprises a plurality of openings through which the gas flux can be pumped from the backside of the object.

3. The apparatus of claim 1 further comprising a frontside heating element within said vacuum chamber for heating the frontside of the object.

4. The apparatus of claim 1 wherein said pump comprises a single pump coupled in fluid communication with a backside outlet and a frontside outlet, the backside outlet coupled in fluid communication with said vacuum chamber through said heated substrate support, and said frontside outlet coupled in fluid communication with said vacuum chamber.

5. The apparatus of claim 4 wherein said pump comprises a turbo molecular pump backed by a mechanical pump.

6. The apparatus of claim 1 wherein said frontside gas inlet is positioned in close proximity to said heated substrate support, such that at least a portion of the gas flux emitted therefrom will contact the frontside of the object supported by said heated substrate support.

7. The apparatus of claim 6 wherein said frontside gas inlet further comprises a plurality of openings for diffusing the gas flux emitted therefrom.

8. The apparatus of claim 1 wherein the frontside gas inlet is designed to reflect heat back to the object.

9. A degassing apparatus comprising:

a vacuum chamber;

a heated substrate support within said vacuum chamber adapted to support an object to be degassed, the object comprising a frontside, and a backside, wherein the backside faces the heated substrate support;

an inlet operatively coupled to said vacuum chamber and adapted to supply at least one gas flux to the backside of the object so as to float the object above said heated substrate support;

a pump operatively coupled to said vacuum chamber and adapted to pump the gas flux from the frontside of the object; and at least one feedback system operatively coupled to said inlet, the at least one feedback system adapted to measure a distance between the object and the heated substrate support, and to adjust the at least one gas flux to the backside of the object so as to maintain a desired distance between the heated substrate support and the object.

10. The apparatus of claim 9 further comprising a frontside heating element within said vacuum chamber for heating the frontside of the object.

11. The apparatus of claim 9 wherein said pump is for continuously pumping said vacuum chamber.

12. The apparatus of claim 10 wherein said pump is a mechanical pump.

13. The apparatus of claim 9 wherein said heated substrate support further comprises a plurality of openings for supplying the at least one gas flux to the backside of the object.

14. A degassing apparatus comprising:

a vacuum chamber;

a heated substrate support within said vacuum chamber for supporting an object to be degassed, the object comprising a frontside and a backside wherein the backside faces said heated substrate support;

a backside gas inlet coupled in fluid communication with the vacuum chamber through the heated substrate support for supplying a first gas flux to the backside of the object to be degassed;

a frontside gas inlet coupled in fluid communication with the vacuum chamber for supplying a second gas flux to the frontside of the object to be degassed, wherein said frontside gas inlet is positioned in close proximity to said heated substrate support such that at least a portion of the second gas flux emitted therefrom will contact the frontside of the object to be degassed, said frontside gas inlet further comprising:

a plurality of openings for diffusing the second gas flux emitted therefrom; and a width that is larger than a width of the object and is larger by between 1 and 10 times a distance between the heated substrate support and the frontside gas inlet;

a first pump coupled in fluid communication with the vacuum chamber through the heated substrate support for pumping the first gas flux from the backside of the object at a first pump rate; and a second pump coupled in fluid communication with the vacuum chamber for pumping the second gas flux from the frontside of the object at a second pump rate; wherein the first gas flux, the second gas flux, the first pump rate and the second pump rate are such that a greater pressure is maintained along the frontside of the object to be degassed.

15. A degassing apparatus comprising:

a vacuum chamber;

a heated substrate support within said vacuum chamber for supporting an object to be degassed, the object comprising a frontside and a backside wherein the backside faces said heated substrate support;

a backside gas inlet coupled in fluid communication with the vacuum chamber through the heated substrate support for supplying a first gas flux to the backside of the object to be degassed;

a frontside gas inlet coupled in fluid communication with the vacuum chamber for supplying a second gas flux to the frontside of the object to be degassed, wherein said frontside gas inlet and said backside gas inlet are further coupled in fluid communication with a common source of dry gas;

a first pump coupled in fluid communication with the vacuum chamber through the heated substrate support for pumping the first gas flux from the backside of the object at a first pump rate; and a second pump coupled in fluid communication with the vacuum chamber for pumping the second gas flux from the frontside of the object at a second pump rate; wherein the first gas flux, the second gas flux, the first pump rate and the second pump rate are such that a greater pressure is maintained along the frontside of the object to be degassed.

16. The apparatus of claim 15 wherein said backside gas inlet comprises a pressure regulator and said frontside gas inlet comprises a flow controller.

17. A degassing apparatus comprising:

a vacuum chamber;

a heated substrate support within said vacuum chamber adapted to support an object to be degassed, the object comprising a frontside and a backside wherein the backside faces said heated substrate support;

a backside gas inlet coupled in fluid communication with the vacuum chamber through the heated substrate support and adapted to supply a first gas flux to the backside of the object to be degassed;

a frontside gas inlet coupled in fluid communication with the vacuum chamber and adapted to supply a second gas flux to the frontside of the object to be degassed, wherein the frontside gas inlet is positioned in close proximity to said heated substrate support such that at least a portion of the second gas flux emitted therefrom will contact the frontside of the object to be degassed and wherein the frontside gas inlet is designed to reflect heat back to the object;

a first pump coupled in fluid communication with the vacuum chamber through the heated substrate support and adapted to pump the first gas flux from the backside of the object at a first pump rate; and a second pump coupled in fluid communication with the vacuum chamber and adapted to pump the second gas flux from the frontside of the object at a second pump rate; wherein the first gas flux, the second gas flux, the first pump rate and the second pump rate are such that a greater pressure is maintained along the frontside of the object to be degassed.

* * * * *